United States Patent
Shiraiwa et al.

(10) Patent No.: US 8,119,477 B2
(45) Date of Patent: Feb. 21, 2012

(54) MEMORY SYSTEM WITH PROTECTION LAYER TO COVER THE MEMORY GATE STACK AND METHODS FOR FORMING SAME

(75) Inventors: Hidehiko Shiraiwa, San Jose, CA (US); YouSeok Suh, Cupertino, CA (US); Harpreet Sachar, San Jose, CA (US); Satoshi Torii, Mie (JP)

(73) Assignee: Spansion LLC, Sunnyvale, CA (US)

( * ) Notice: Subject to any disclaimer, the term of this patent is extended or adjusted under 35 U.S.C. 154(b) by 1102 days.

(21) Appl. No.: 11/469,164

(22) Filed: Aug. 31, 2006

(65) Prior Publication Data
US 2008/0121981 A1  May 29, 2008

(51) Int. Cl.
*H01L 21/331* (2006.01)
(52) U.S. Cl. .... 438/257; 438/261; 257/314; 257/E21.18
(58) Field of Classification Search .......... 438/257, 438/261, 288, 786, 791, 954, FOR. 431; 257/314, E21.18
See application file for complete search history.

(56) References Cited

U.S. PATENT DOCUMENTS

| | | | |
|---|---|---|---|
| 6,642,573 B1 * | 11/2003 | Halliyal et al. | 257/316 |
| 6,696,331 B1 | 2/2004 | Yang et al. | |
| 6,713,127 B2 | 3/2004 | Subramony et al. | |
| 6,740,605 B1 * | 5/2004 | Shiraiwa et al. | 438/795 |
| 6,884,733 B1 | 4/2005 | Dakshina-Murthy et al. | |
| 6,933,219 B1 * | 8/2005 | Lingunis et al. | 438/593 |
| 7,049,180 B2 | 5/2006 | Nomoto et al. | |
| 7,060,627 B2 | 6/2006 | Gutman et al. | |

* cited by examiner

*Primary Examiner* — Khiem D Nguyen
(74) *Attorney, Agent, or Firm* — Mikio Ishimaru

(57) ABSTRACT

A memory system is provided including forming a memory gate stack having a charge trap layer over a semiconductor substrate, forming a protection layer to cover the memory gate stack, and forming a protection enclosure for the charge trap layer with the protection layer and the memory gate stack.

20 Claims, 5 Drawing Sheets

MEMORY SYSTEM WITH PROTECTION LAYER TO COVER THE MEMORY GATE STACK AND METHODS FOR FORMING SAME

TECHNICAL FIELD

The present invention relates generally to memory system and more particularly to non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Various types of non-volatile memories have been developed including electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture which results in decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable.

Silicon content in the nitride layer improves the programming and erasing performances but offers poor data retention. Although silicon content plays an important role in charge-trapping efficiency, it does not have same constructive effect on leakage characteristics. The interface between the charge trapping layer with both the top blocking oxide layer and the bottom tunneling oxide layer present both scaling and functional problems despite the silicon content as well as add cost to the manufacturing process.

Semiconductor fabrication processes have made possible the fabrication of advanced integrated circuits on a semiconductor wafer. These semiconductor fabrication processes are complex, requiring extensive control and care to avoid fabricating defective integrated circuits. Moreover, within the advanced integrated circuits, specialized components are utilized to implement particular functionality. As a result, the advanced integrated circuits undergo a first group of semiconductor fabrication processes to fabricate standard components and undergo a second group of semiconductor fabrication processes to fabricate the specialized components.

In particular, a flash memory chip has a memory array and a plurality of support and control circuits. Generally, the memory array is comprised of a plurality of flash memory devices or cells. Each flash memory device includes a stacked gate structure. The support and control circuits are typically comprised of standard components such as MOS (Metal Oxide Semiconductor) transistors having gate structures, whereas the support and control circuits are typically formed in the peripheral area of the flash memory chip.

In the fabrication of the flash memory chip, a first lithographic process, a first etching process, and a resist removal process are performed to form the stacked gate structure of the flash memory device. Separately, a second lithographic process, a second etching process, and the resist removal process are performed to form the gate structure of the MOS transistor. Typically, the stacked gate structure is formed in the core area and then the gate structure is formed in the peripheral area.

The fabrication process damages the stacked gate structure of the flash memory. Methods to repair the damage to some portion of the stacked gate structure further damages other portion of the stacked gate structure, such as the charge trapping layer.

Thus, a need still remains for a memory cell system providing low cost manufacturing, improved yields, improved programming performance, improved erasing performance, and improved data retention of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory cell system including forming a memory gate stack having a charge trap layer over a semiconductor substrate, forming a protection layer to cover the memory gate stack, and forming a protection enclosure for the charge trap layer with the protection layer and the memory gate stack.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
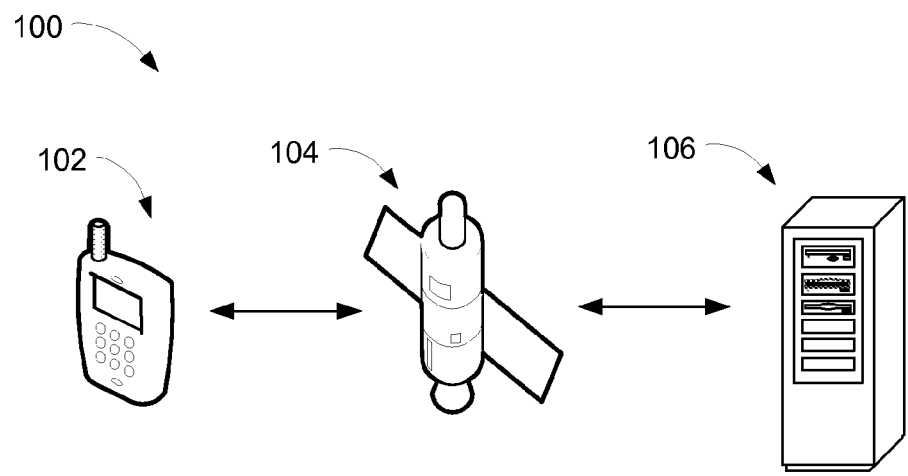
FIG. 1 is schematic views of examples of electronics systems in which various aspects of the present invention may be implemented.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown schematic views of examples of electronics systems 100 in which various aspects of the present invention may be implemented. A smart phone 102, a satellite 104, and a compute system 106 are examples of the electronic systems 100 using the present invention. The electronic systems 100 may be any system that performs any function for the creation, transportation, storage, and consumption of information. For example, the smart phone 102 may create information by transmitting voice to the satellite 104. The satellite 104 is used to transport the information to the compute system 106. The compute system 106 may be used to store the information. The smart phone 102 may also consume information sent from the satellite 104.

Figure 2:
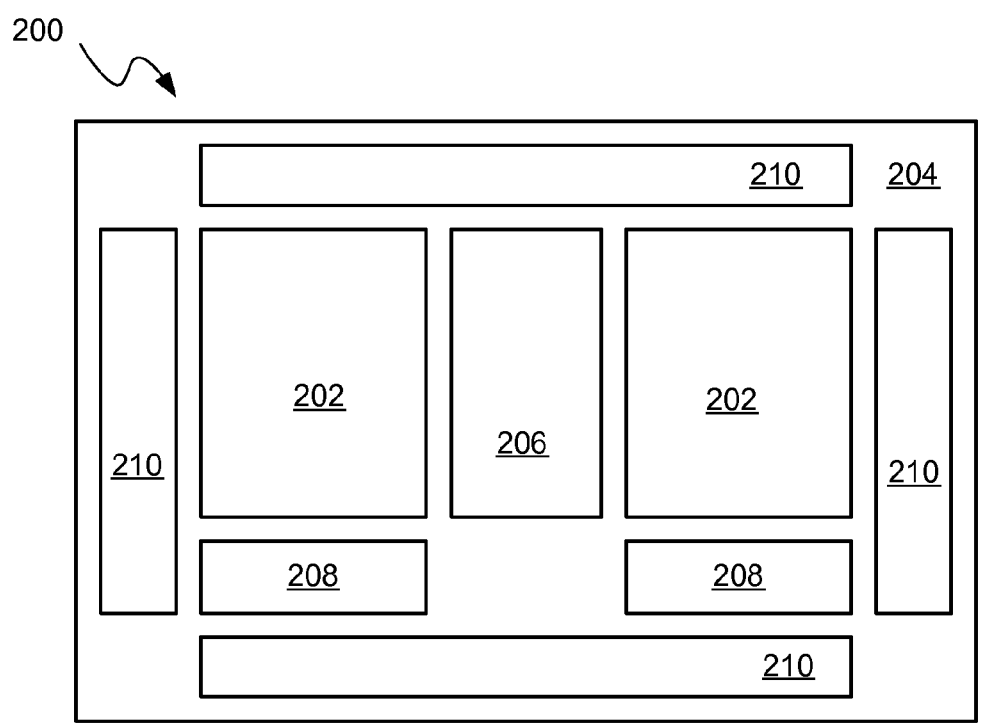
FIG. 2 is a plan view of a device in which various aspects of the present invention may be implemented.

Referring now to FIG. 2, therein is shown a plan view of a device 200 in which various aspects of the present invention may be implemented. The device 200 is a semiconductor device including memory systems 202 having the present invention. The device 200 commonly includes a semiconductor substrate 204 in which one or more high-density core regions and one or more low-density peripheral portions are formed.

High-density core regions typically include one or more of the memory systems 202. Low-density peripheral portions typically include input/output (I/O) circuitry and programming circuitry for individually and selectively addressing a location in each of the memory systems 202. The programming circuitry is represented in part by and includes one or more x-decoders 206 and y-decoders 208, cooperating with I/O circuitry 210 for connecting the source, gate, and drain of selected addressed memory cells to predetermined voltages or impedances to effect designated operations on the memory cell, e.g., programming, reading, and erasing, and deriving necessary voltages to effect such operations.

For illustrative purposes, the device 200 is shown as a memory device, although it is understood that the device 200 may other semiconductor devices having other functional blocks, such as a digital logic block, a processor, or other types of memories. Also for illustrative purposes, the device 200 is described as a single type of semiconductor device, although it is understood that the device 200 may be a multichip module utilizing the present invention with other types of devices of similar or different semiconductor technologies, such as power devices or microelectromechanical systems (MEMS). Further for illustrative purposes, the device 200 is described as a semiconductor device, although it is understood that the device 200 may be a board level product including the present invention.

Figure 3:
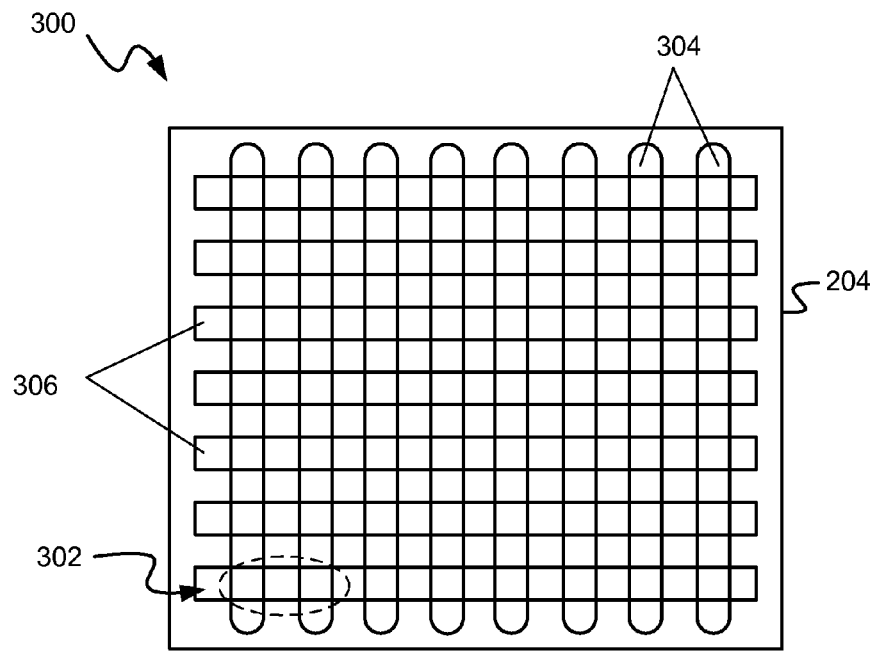
FIG. 3 is a plan view of a portion of a memory system in which various aspects of the present invention may be implemented.

Referring now to FIG. 3, therein is shown a plan view of a portion of a memory system 300 in which various aspects of the present invention may be implemented. The memory system 300 may represent one of the memory systems 202 of FIG. 2. The memory system 300 have M×N arrays of a memory cell 302. The semiconductor substrate 204 has a plurality of bit lines 304 extending in parallel with a plurality of word lines 306 extending in parallel and at right angles to the plurality of the bit lines 304. The word lines 306 and the bit lines 304 have contacts and interconnections (not shown) to the programming circuitry discussed in FIG. 2.

Figure 4:
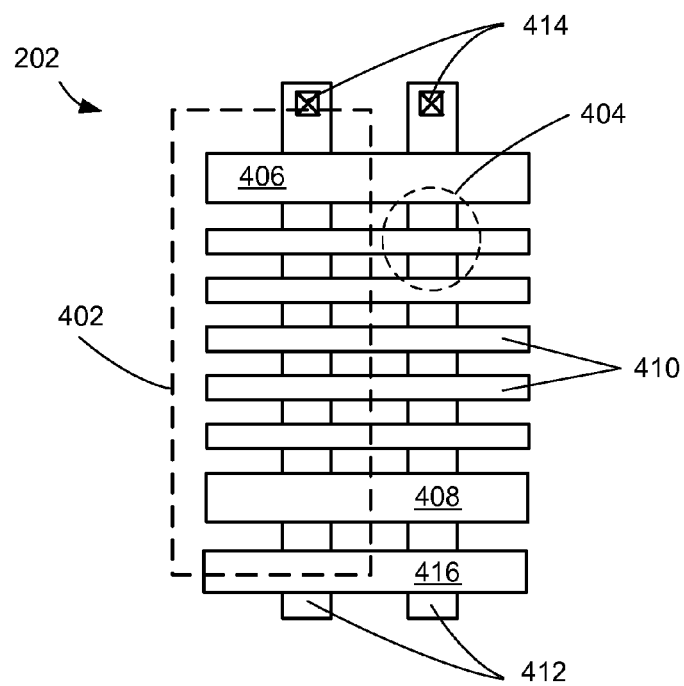
FIG. 4 is a more detailed top view of the portion of the memory system in which various aspects of the present invention may be implemented.

Referring now to FIG. 4, therein is shown a more detailed top view of the portion of the memory system 300 in which various aspects of the present invention may be implemented. The top view depicts two instances of memory sections 402, such as NAND memory string. The memory sections 402 have memory cells 404 between a drain select line 406 and a source select line 408. Each of the memory cells 404 may represent the memory cell 302 of FIG. 3. The memory cells 404 have word lines 410 above bit lines 412, wherein the word lines 410 and the bit lines 412 are perpendicular to each other. The drain select line 406 and the source select line 408 are also perpendicular to the bit lines 412. Contacts 414, such as drain contacts, are on the bit lines 412 next to the drain select line 406. A source line 416 is perpendicular to the bit lines 412 and next to the source select line 408.

Figure 5:
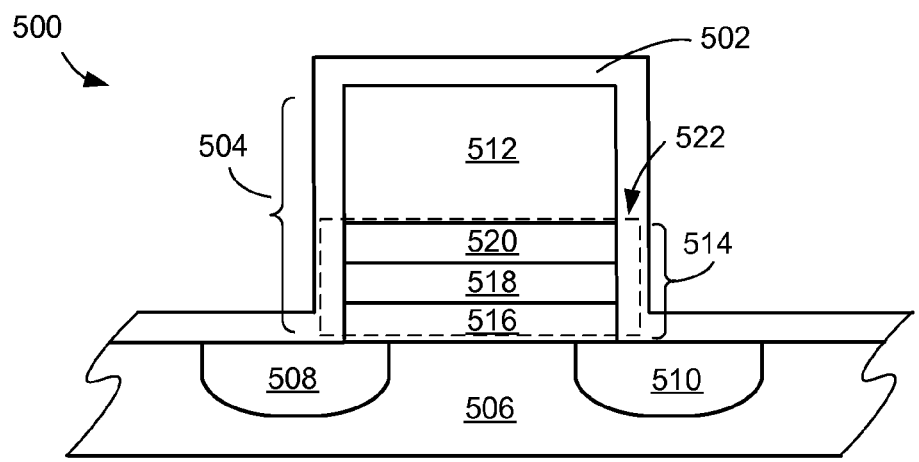
FIG. 5 is a cross-sectional view of a memory cell in an embodiment of the present invention.

Referring now to FIG. 5, therein is shown a cross-sectional view of a memory cell 500 in an embodiment of the present invention. The memory cell 500 may represent one of the memory cells 404 of FIG. 4. The memory cell 500 includes a protection layer 502 above a memory gate stack 504 and a semiconductor substrate 506, such as a p-type silicon substrate. The protection layer 502, such as a high temperature oxidation (HTO) liner of silicon dioxide ($SiO_2$), protects the memory gate stack 504 from further processing for the IO circuitry 210 of FIG. 2 and other portions of the device 200 of FIG. 2 not part of the memory system 300 of FIG. 2. The protection layer 502 may be formed by any number of processes, such as a chemical vapor deposition (CVD) using a reaction between $SiH_4$ and $N_2O$ at a temperature around 800C. The memory gate stack 504 is also above the semiconductor substrate 506.

The memory gate stack 504 is between a first region 508, such as a source of an n-type, and a second region 510, such as a drain of an n-type. The memory gate stack 504 includes a semiconductor gate 512, such as a word line of polysilicon, tin silicon (TiSi), or nickel silicon (NiSi) below the protection layer 502 and above a charge-storage stack 514. The protection layer 502 is formed as a single conformal layer of uniform thickness on the charge-storage stack 514, which is above the semiconductor substrate 506.

The charge-storage stack 514 provides a region between the first region 508, such as an n-type region, and the second region 510, such as an n-type region, for storage of electrical charges. The semiconductor substrate 506 and the semiconductor gate 512, such as CoSi, W, or WSi, provide access for reading and erasing storage locations of the electrical charges.

The charge-storage stack 514 has multiple layers. A first insulator layer 516, such as a bottom tunneling oxide layer of silicon dioxide ($SiO_2$), of the charge-storage stack 514 is over the semiconductor substrate 506. A thickness of the first insulator layer 516 may be a number of predetermined values, such as approximately 50 angstroms. A charge trap layer 518 of the charge-storage stack 514 is over the first insulator layer 516. The charge trap layer 518 provides regions for storage of the electrical charges and has a thickness of a number of predetermined values, such as a range from 80 to 90 angstroms. The charge trap layer 518 includes a charge trapping material, such as a silicon rich nitride (SRN or SiRN) or silicon nitride ($Si_xN_y$). A second insulator layer 520, such as a top blocking oxide layer of silicon dioxide ($SiO_2$), of the charge-storage stack 514 is over the charge trap layer 518. The second insulator layer 520 may be a number of predetermined values, such as approximately 50 angstroms.

The protection layer 502, the first insulator layer 516, and the second insulator layer 520 form a protection enclosure 522 for the charge trap layer 518. The insulating properties of the protection enclosure 522 provide some thermal as well as physical isolation for the charge trap layer 518.

The silicon-rich nitride may be formed by a chemical vapor deposition process (CVD) wherein two types of gases, such as $NH_3$ and $SiH_4$, interact during the deposition of the silicon-rich nitride. A ratio of the gases, such as $NH_3:SiH_4$, is below approximately 360:60, but higher than approximately 53:330, to be considered silicon-rich nitride. The silicon-rich nitride may include a higher ratio, such as 58:360, to provide conductivity for single bit storage.

For illustrative purposes, the charge trap layer 518 is shown as having one layer of charge trapping material, although it is understood that the number layers may differ. Also for illustrative purpose, the layers in the charge-storage stack 514 is shown as stratified, although it is understood that the layers may not be stratified but form a gradient of similar material with difference concentrations, such as silicon or nitride concentration difference from bottom to the top of the charge-storage stack 514.

Figure 6:
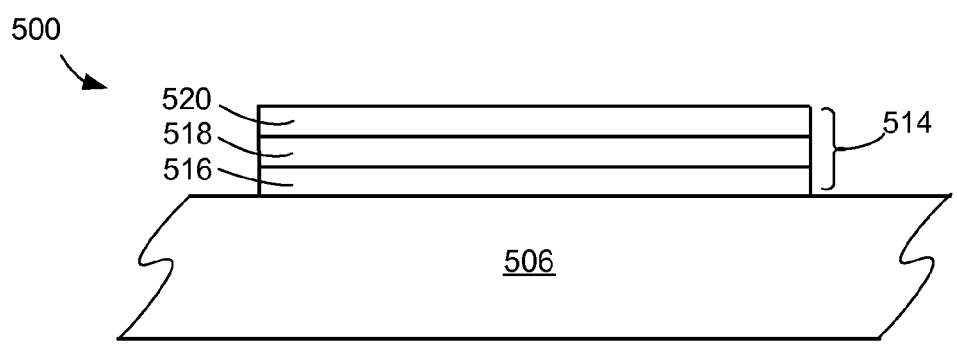
FIG. 6 is a more detailed cross-sectional view of the memory cell of FIG. 5 in a formation phase of the charge-storage stack.

Referring now to FIG. 6, therein is shown a more detailed cross-sectional view of the memory cell 500 of FIG. 5 in a formation phase of the charge-storage stack 514. The first insulator layer 516 is formed on the semiconductor substrate 506. The first insulator layer 516 may be formed by any number of processes, such as thermal oxidation. The silicon rich nitride (SiRN) of the charge trap layer 518 is deposited on the first insulator layer 516 and over the semiconductor substrate 506. The second insulator layer 520 may be deposited on the charge trap layer 518 by any number of processes, such as atomic layer deposition (ALD).

Alternatively, a top portion of the charge trap layer 518 may undergo oxidation by any number of processes, such as steam oxidation or slot plane antenna (SPA) plasma technique, to form the second insulator layer 520, as the top blocking oxide layer, from the upper portion of the nitride or regular silicon nitride layer of the charge trap layer 518. The second insulator layer 520 is also over the first insulator layer 516 and the semiconductor substrate 506.

Figure 7:
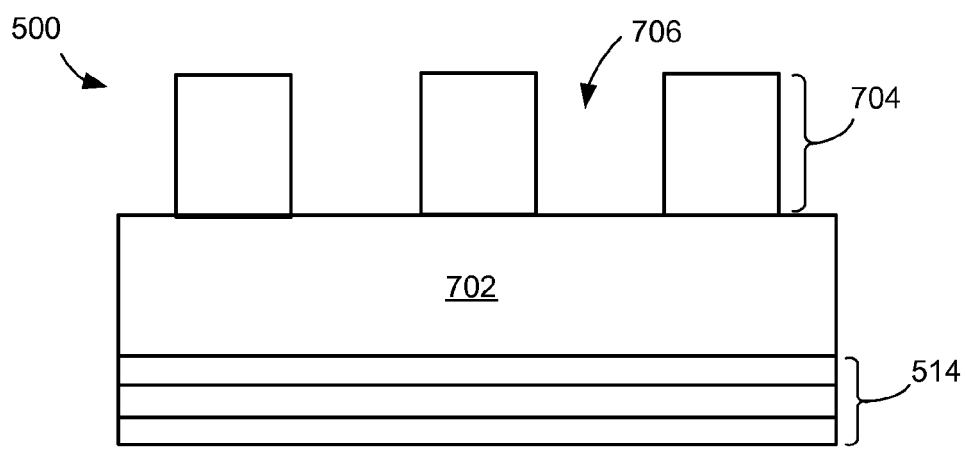
FIG. 7 is a cross-sectional view of the structure of FIG. 6 in a masking phase.

Referring now to FIG. 7, therein is shown a cross-sectional view of the structure of FIG. 6 in a masking phase. A semiconductor gate layer 702, such as a layer of polysilicon, tin silicon (TiSi), or nickel silicon (NiSi), is formed on the charge-storage stack 514. The semiconductor gate layer 702, such as a layer including CoSi, W, or WSi, may be formed by any number of processes, such as deposition or epitaxy growth. A mask 704, such as a photoresist mask, is formed above the semiconductor gate layer 702 in a predetermined pattern with recesses 706. The recesses 706 expose the semiconductor gate layer 702 for further processes. The mask 704 protects the semiconductor gate layer 702 not exposed by the recesses 706.

Figure 8:
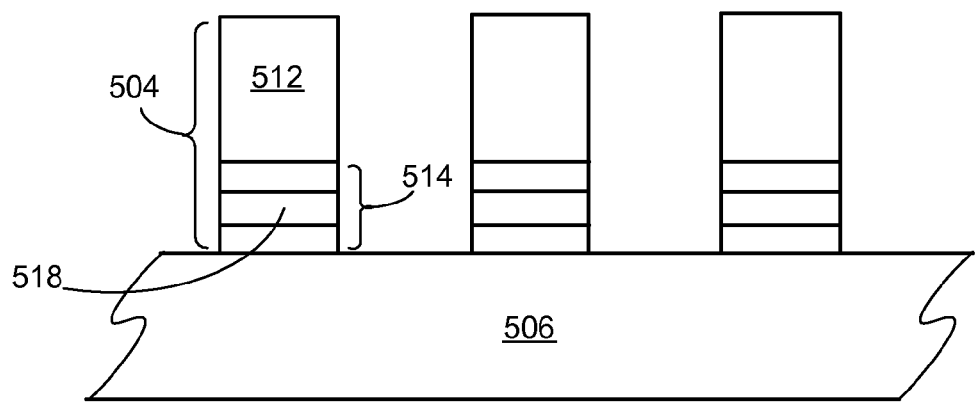
FIG. 8 is a cross-sectional view of the structure of FIG. 7 in a formation phase of the memory gate stack.

Referring now to FIG. 8, therein is shown a cross-sectional view of the structure of FIG. 7 in a formation phase of the memory gate stack 504. The structure of FIG. 7 undergo etching process removing the volume of the semiconductor gate layer 702 of FIG. 7 not covered by the mask 704 of FIG. 7 The etching processes forms a number of the memory gate stack 504 above the semiconductor substrate 506.

The etching process may damage the charge-storage stack 514 along the vertical sides formed by the etching process. To repair the etching damage, the memory gate stack 504 as well as the semiconductor substrate 506 undergo re-oxidation, such as furnace oxidation. The re-oxidation process may be at an elevated temperature that may change the characteristic of the charge trap layer 518. The material characteristics of the silicon rich nitride impacts the electrical, chemical, and optical properties of the charge trap layer 518.

The mask 704 is removed by any number of processes, such as removal using acids. Some removal processes and removal materials used, have undesired effects on the semiconductor gate 512. The removal of the mask 704 inevitably removes some portion of the semiconductor gate 512. The dopant amounts in the semiconductor gate 512 may also interact with the removal material.

These undesired effects from both etching process and removal of the mask 704 change the threshold voltage of the memory cell 500 of FIG. 5. Further processing to form other portions of the device 200 of FIG. 2 will further damage the memory gate stack 504.

Figure 9:
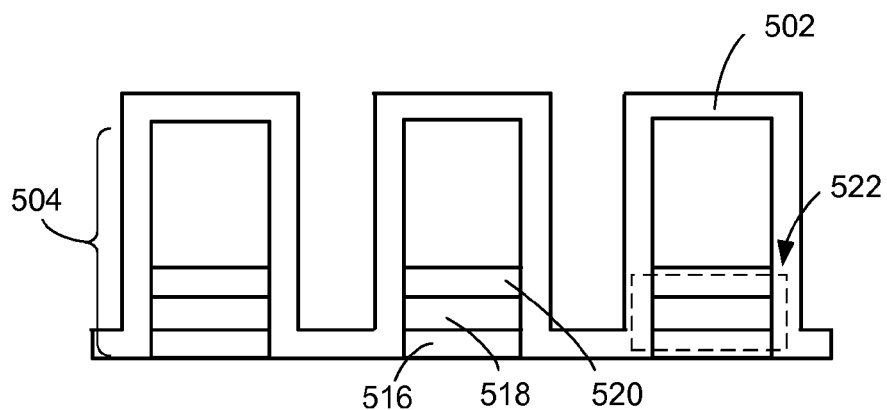
FIG. 9 is a cross-sectional view of the structure of FIG. 8 in a formation phase of the protection layer.

Referring now to FIG. 9, therein is shown cross-sectional view of the structure of FIG. 8 in a formation phase of the protection layer 502. The protection layer 502 may be formed by any number of processes, such as high temperature oxidation or atomic layer deposition. The protection layer 502, the first insulator layer 516, and the second insulator layer 520 forms the protection enclosure 522 to isolate the charge trap layer 518 from further processing of the other portions of the device 200 of FIG. 2, such as the IO circuitry 210 of FIG. 2.

The protection layer 502 also protects the memory gate stack 504 and the rest of the memory cell 500 from further processing of the other portions of the device 200 of FIG. 2, such as the IO circuitry 210 of FIG. 2. The protection layer 502 is sufficiently thick to protect the memory cell 500 without increasing space between the word lines 410 of FIG. 4 and the bit lines 412 of FIG. 4. For illustrative purpose, the protection layer 502 is described an oxide layer, although it is understood that the protection layer 502 may be other types of insulating layer, such as oxynitride.

Figure 10:
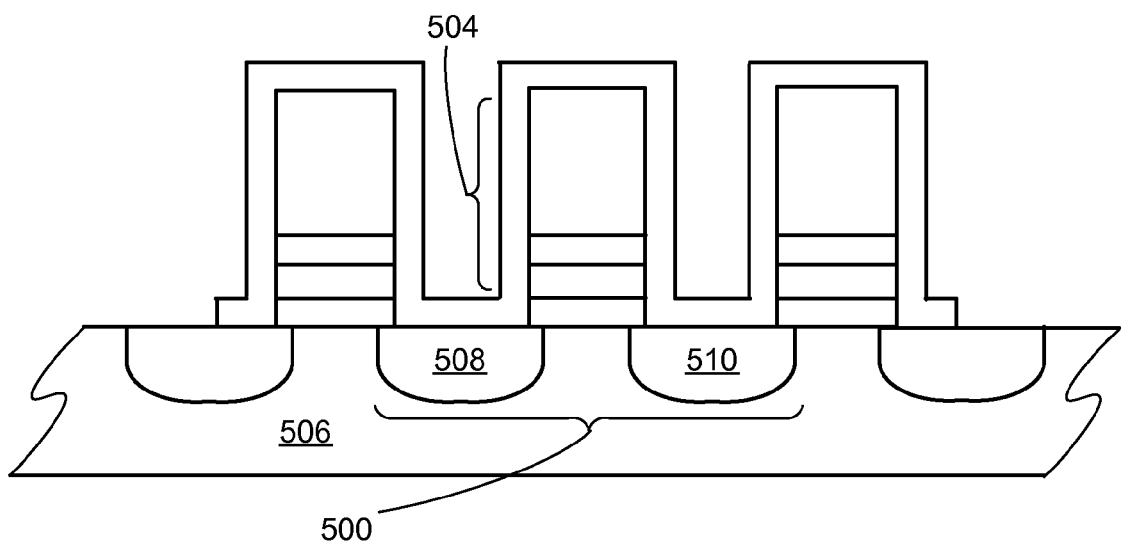
FIG. 10 is a cross-sectional view of the structure of FIG. 9 in an implantation phase.

Referring now to FIG. 10, therein is shown a cross-sectional view of the structure of FIG. 9 in an implantation phase. Deep implantation changes the semiconductor substrate 506 not covered by the memory gate stack 504 forming the first region 508 and the second region 510. An annealing process aids the implantation into the semiconductor substrate 506.

The device 200 of FIG. 2 undergoes other processing steps forming other portions of the device 200, such as the IO circuitry 210. The additional processing includes etching and photoresist removal. The protection layer 502 protects the memory gate stack 504 from these additional processing steps.

As gate stacks at the other portions of the device 200 undergo re-oxidation, the oxide is not localized on the sides of the gate structures, but extends to a point near the thin gate oxide layer underlying the gate conductor material. The newly-formed oxide may encroach into the gate oxide layer, which may adversely increase the thickness of the gate oxide or reduce the shape definition of the corner between the gate structure and the underlying substrate. Thus, the polysilicon re-oxidation may affect the precision with which gate structures may be formed. The protection layer 502 isolates the memory gate stack 504 in the memory cell 500 from the re-oxidation to the other portions of the device 200.

The protection layer 502 in conjunction the first insulator layer 516 and the second insulator layer 520 provides some thermal isolation for the charge trap layer 518. This minimizes changes to the characteristics of the silicon rich nitride of the charge trap layer 518 during re-oxidation of other portions of the device 200.

Figure 11:
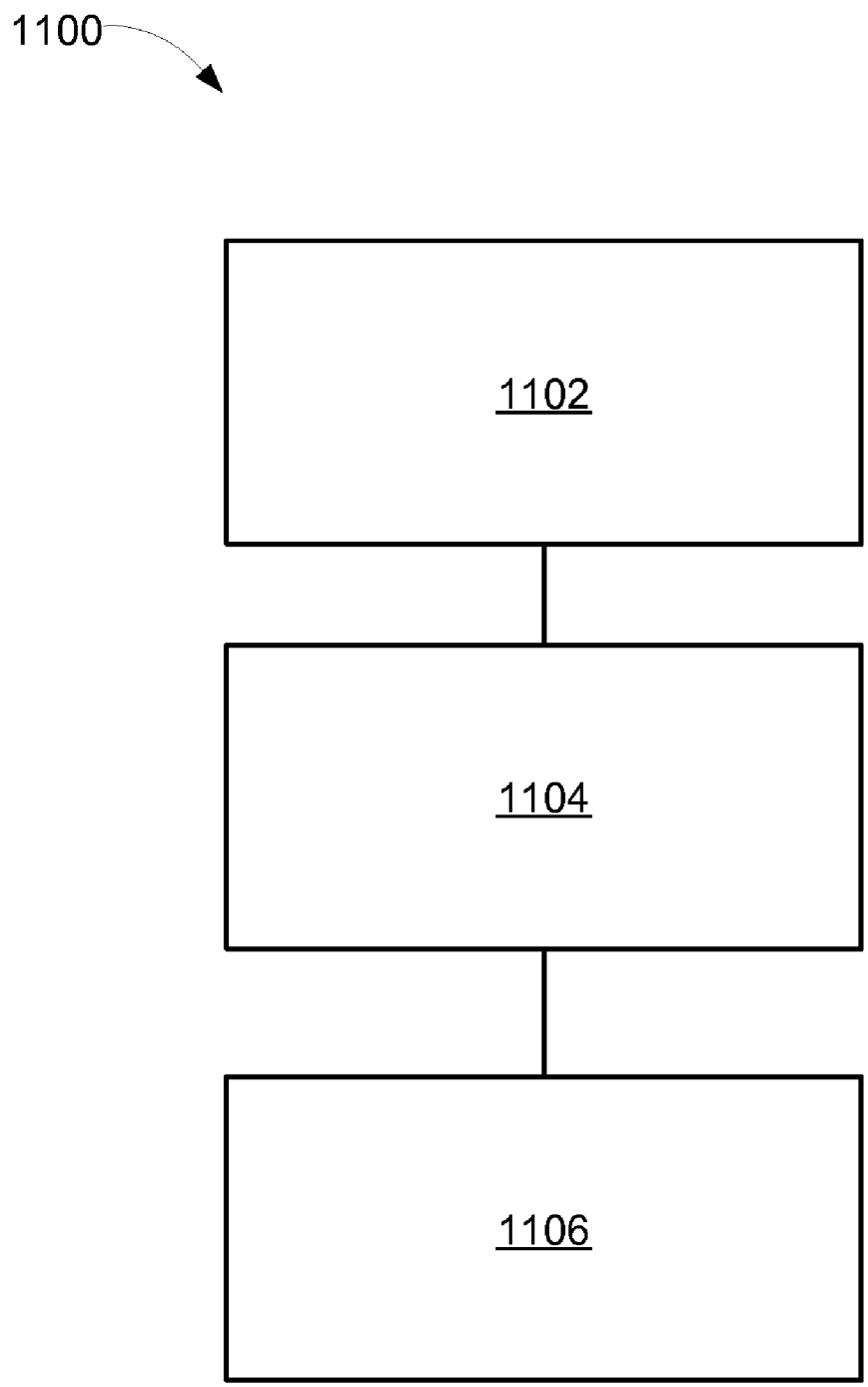
FIG. 11 is a flow chart of a memory system for the manufacture of the memory system in an embodiment of the present invention.

Referring now to FIG. 11, therein is shown a flow chart of a memory system 1100 for manufacture of the memory system 300 in an embodiment of the present invention. The system 1100 includes forming a memory gate stack having a charge trap layer over a semiconductor substrate in a block 1102; forming a protection layer to cover the memory gate stack in a block 1104; and forming a protection enclosure for the charge trap layer with the protection layer and the memory gate stack in a block 1106.

It has been discovered that the present invention thus has numerous aspects.

It has been discovered that the present invention improves erase and program performance as well as reliability of the memory system. The present invention provides protection layer, such as a HTO gate liner, from further processing after the memory gate stack has been formed.

An aspect of the present invention is that the protection layer provides better control and functional reliability of the semiconductor gate of the memory gate stack. The semiconductor gate is not subjected to multiple photoresist removal steps thereby providing better thickness and dopant concentration control.

Another aspect of the present invention is that the protection layer protects the charge trap layer of the memory gate stack from additional device processing. This provides better control, reliability, and yield of the memory system.

Yet another aspect of the present invention is that the protection layer protects the blocking oxide and the tunneling oxide from additional device processing. This limits the number of re-oxidation steps required to repair etching damage. The re-oxidation steps typically occur at elevate temperatures that changes the characteristic of the charge trap layer of silicon rich nitride.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the memory system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A memory manufacturing method comprising:
    forming a memory gate stack, having a charge trap layer, over a semiconductor substrate;
    forming a protection layer of a single conformal layer and uniform thickness on the charge trap layer; and
    forming a protection enclosure for the charge trap layer with the protection layer and the memory gate stack.

2. The manufacturing method as claimed in claim 1 wherein forming the protection layer to cover the memory gate stack includes forming an oxide liner.

3. The manufacturing method as claimed in claim 1 wherein forming the memory gate stack, having the charge trap layer, includes:
    forming a tunneling layer below the charge trap layer;
    forming a blocking layer above the charge trap layer; and
    forming a gate above the blocking layer.

4. The manufacturing method as claimed in claim 1 wherein forming the memory gate stack, having the charge trap layer, includes forming the charge trap layer with silicon rich nitride.

5. The manufacturing method as claimed in claim 1 further comprising forming a device or an electronic system with the memory system.

6. A memory manufacturing method comprising:
    forming a tunneling oxide layer over a semiconductor substrate;
    forming a trap nitride layer over the tunneling oxide layer;
    forming a blocking oxide layer over the trap nitride layer;
    forming a memory gate stack, having a gate layer over the blocking oxide layer, from the gate layer through the tunneling oxide layer;
    forming a protection layer of a single conformal layer and uniform thickness on the trap nitride layer; and forming a protection enclosure for the trap nitride layer with the protection layer, the tunneling oxide layer, and the blocking oxide layer.

7. The manufacturing method as claimed in claim 6 wherein forming the protection enclosure for the charge trap layer includes forming a physical and thermal insulation for the trap nitride layer.

8. The manufacturing method as claimed in claim 6 further comprising:
   forming a source and a drain in the semiconductor substrate;
   wherein forming the memory gate stack includes:
   forming the memory gate stack between the source and the drain.

9. The manufacturing method as claimed in claim 6 wherein forming the memory gate stack, having the gate layer, includes forming the gate layer comprised of a conductive material.

10. The manufacturing method as claimed in claim 6 wherein forming the trap nitride layer includes forming the trap nitride layer comprised of a silicon.

11. A memory system comprising:
    a memory gate stack, having a charge trap layer, over a semiconductor substrate;
    a protection layer of a single conformal layer and uniform thickness on the charge trap layer; and
    a protection enclosure for the charge trap layer with the protection layer and the memory gate stack.

12. The system as claimed in claim 11 wherein the protection layer is an oxide liner.

13. The system as claimed in claim 11 wherein the memory gate stack, having the charge trap layer, includes:
    a tunneling layer below the charge trap layer;
    a blocking layer above the charge trap layer; and
    a gate above the blocking layer.

14. The system as claimed in claim 11 wherein the charge trap layer is comprised of a silicon rich nitride.

15. The system as claimed in claim 11 further comprising a device or an electronic system with the memory system.

16. The system as claimed in claim 11 wherein:
    the memory gate stack, having the charge trap layer, over the semiconductor substrate has a tunneling oxide layer below the charge trap layer and a blocking oxide layer above the charge trap layer;
    the protection layer to cover the memory gate stack is an oxide liner; and
    the protection enclosure for the charge trap layer with the protection layer includes the tunneling oxide layer and the blocking oxide layer.

17. The system as claimed in claim 16 wherein the protection enclosure for the charge trap layer is a physical and thermal insulation for the charge trap layer.

18. The system as claimed in claim 16 further comprising:
    a source and a drain in the semiconductor substrate;
    wherein the memory gate stack is between the source and the drain.

19. The system as claimed in claim 16 wherein the memory gate stack, having the gate layer, is comprised of a conductive material.

20. The system as claimed in claim 16 wherein the charge trap layer is comprised of a silicon.

\* \* \* \* \*